United States Patent [19]

Kamin

[11] Patent Number: 4,792,956

[45] Date of Patent: Dec. 20, 1988

[54] LASER DIODE INTENSITY AND WAVELENGTH CONTROL

[75] Inventor: George W. Kamin, Albuquerque, N. Mex.

[73] Assignee: Litton Systems, Inc., Beverly Hills, Calif.

[21] Appl. No.: 862,759

[22] Filed: May 13, 1986

[51] Int. Cl.[4] .......... H01S 3/13

[52] U.S. Cl. .......... 372/29; 372/38

[58] Field of Search .......... 372/29, 33, 31, 32, 372/34, 38, 44

[56] References Cited

U.S. PATENT DOCUMENTS

| | | | |
|---|---|---|---|
| 3,411,849 | 11/1968 | Aronowitz | 356/28 |
| 3,588,253 | 6/1971 | Wittmann | 356/93 |
| 3,697,887 | 10/1972 | Lee et al. | 331/94.5 |
| 4,081,670 | 3/1978 | Albanese | 250/199 |
| 4,101,847 | 7/1978 | Albanese | 331/94.5 |
| 4,109,217 | 8/1978 | Brackett et al. | 331/94.5 |
| 4,153,151 | 6/1979 | Grundler | 307/312 |
| 4,177,436 | 12/1979 | Dixon et al. | 331/94.5 |
| 4,181,901 | 1/1980 | Heyke | 331/94.5 |
| 4,187,475 | 2/1980 | Wieder | 331/94.5 |
| 4,237,427 | 12/1980 | Holland | 331/94.5 |
| 4,292,606 | 9/1981 | Trimmel | 332/7.51 |
| 4,307,469 | 12/1981 | Casper et al. | 455/163 |
| 4,344,173 | 8/1982 | Straus | 372/38 |
| 4,349,906 | 9/1982 | Scifres et al. | 372/50 |
| 4,385,387 | 5/1983 | Trimmel | 372/29 |
| 4,577,320 | 3/1986 | Yoshikawa et al. | 372/29 |
| 4,583,228 | 4/1986 | Brown et al. | 372/32 |
| 4,612,671 | 9/1986 | Giles | 455/609 |
| 4,616,930 | 10/1986 | Martin | 356/350 |
| 4,631,728 | 12/1986 | Simons | 372/38 |

FOREIGN PATENT DOCUMENTS

| | | |
|---|---|---|
| 0093942 | 4/1983 | European Pat. Off. . |
| WO84/03592 | 3/1983 | PCT Int'l Appl. . |
| 2007015A | 10/1978 | United Kingdom . |
| 2054949A | 7/1979 | United Kingdom . |
| 2052841A | 5/1980 | United Kingdom . |
| 2154787A | 1/1984 | United Kingdom . |
| 2168838A | 3/1984 | United Kingdom . |

OTHER PUBLICATIONS

Kaminow, "Balanced Optical Discriminator", *Applied Optics*, 1964, vol. 3, No. 4, pp. 507–510.

White, "Frequency Stabilization of Gas Lasers", *Journal of Quantum Electronics*, 1965, vol. QE 1, No. 8, pp. 349–350.

Kimura et al., "Temperature Compensation of Birefringent Optical Fibers", *Proc. IEEE*, Aug. 1971, pp. 1373–1374.

*Primary Examiner*—William L. Sikes
*Assistant Examiner*—B. Randolph
*Attorney, Agent, or Firm*—John H. Lynn

[57] ABSTRACT

The actual values of intensity and wavelength of the optical signal output from a laser diode are compared to desired values thereof to generate intensity and wavelength error signals. The rates of change of the wavelength and intensity as functions of temperature and injection current about nominal operating values of the temperature and injection current are determined and used to calculate an injection current error signal and a temperature error signal for adjusting the injection current and temperature, respectively. The time response of the injection current and temperature are decoupled, which allows independent adjustment of the time constants of the exponential expressions for injection current and temperature. Providing independent adjustment of the time constants of the injection current and temperature variations permits the desired signal wavelength and intensity to be obtained in a time efficient manner.

8 Claims, 3 Drawing Sheets

VARIATION IN LASER DIODE WAVELENGTH WITH CURRENT

LASER DIODE INTENSITY AND WAVELENGTH CONTROL

BACKGROUND OF THE INVENTION

This invention relates generally to coherent light sources and particularly to laser diodes. Still more particularly, this invention relates to apparatus and methods for controlling the emission wavelength and output intensity of laser diodes.

The development and practical implementation of sensing systems that require an optical signal input and high data rate fiber optic communication systems require stability in the optical pulses input to the optical fibers. Such systems may use semiconductor diode lasers as light sources.

There are at least three groups of laser diodes that are classified according to structure. Simple diode lasers are called homostructure lasers because they are made of a single semiconductor material. A homostructure laser diode may comprise, for example, regions of n-type and p-type gallium arsenide. The combination of electrons injected from the n-region into the p-region with holes, or positive charge carriers, in the p-region causes the emission of laser light. All laser diodes include two polished parallel faces that are perpendicular to the plane of the junction of the p-type and n-type regions. The emitted light reflects back and forth across the region between the polished surfaces and is consequently amplified on each pass through the junction.

A typical single heterostructure semiconductor laser includes an additional layer of aluminum gallium arsenide, in which some of the gallium atoms in the gallium arsenide has been replaced by aluminum atoms. Injected electrons are stopped at the aluminum gallium arsenide layer, which causes the emission of a higher intensity laser light than ordinarily occurs with a homostructure diode laser.

A typical double heterostructure semiconductor laser includes three layers of gallium arsenide separated by two layers of aluminum gallium arsenide. Preselection of either n-type or p-type materials cause further increases of the intensity of the emitted laser beam.

The intensity and wavelength of the light emitted from a laser diode varies as functions of the operating temperature and the injection current applied thereto in order to supply electrons thereto. Effective use of a laser diode as a light source often requires an output of known intensity and wavelength. Both the intensity and the wavelength are non-linear functions of the injection current and the operating temperature of the laser diode.

Previous methods of regulating the emission wavelength or intensity have used univariant control systems where either the temperature or the injection current is varied to adjust the wavelength. Such systems can exhibit damped harmonic oscillator coupling between the injection current and temperature. Prior control systems that regulate the intensity and the wavelength have the disadvantage of requiring excessively long times to reach the desired wavelength and intensity. In some severe operational situations, the desired values of wavelength and intensity are never obtained because the system oscillates about the desired values.

SUMMARY OF THE INVENTION

The present invention provides an improved apparatus and method for controlling the emission wavelength and output intensity of a laser diode. The control system and method of the present invention provide the capability of reducing the time required to obtain desired values of intensity and wavelength for the output signal of a laser diode consistent with thermal delay times. Control stability is enhanced due to the closed loop system, which provides intensity and wavelength that exponentially approach the desired values with the injection current and temperature being uncoupled. The ability to set time constants independently for current and temperature affords several advantages in practical system designs in which thermal lags delay the temperature response.

The method of the invention for simultaneously controlling the intensity and wavelength of an optical signal output from a laser diode may comprise the steps of sensing the intensity of the optical signal and comparing a desired value of the intensity to the sensed intensity to produce an intensity error signal. The method may further comprise the steps of sensing the wavelength of the optical signal and comparing a desired value of the wavelength to the sensed wavelength to produce a wavelength error signal. The method further comprises the steps of producing a temperature variation signal that is a function of the wavelength and intensity error signals which are temperature dependant and producing an injection current variation signal that is a function of the wavelength and intensity error signals which are dependent on injection current. The method of the invention also includes the steps of adjusting the temperature of the laser diode as a function of the temperature variation signal and adjusting the injection current of the laser diode as a function of the injection current variation signal.

The step of determining the temperature variation signal may include the steps of calculating the wavelength error signal as a function of the rate of change of intensity of the optical signal with respect to injection current of the laser diode at a predetermined operating temperature of the laser diode and as a function of the rate of change of intensity of the optical signal with respect to injection current of the laser diode at a predetermined operating temperature of the laser diode.

The step of determining the injection current variation signal may include the steps of calculating the wavelength error signal as a function of the rate of change of wavelength with respect to temperature of the laser diode at a predetermined operating injection current change and as a function of the rate of change of intensity with respect to temperature of the laser diode at a predetermined operating injection current.

A system for simultaneously controlling the intensity and wavelength of an optical signal output from a laser diode, comprises means for sensing the intensity of the optical signal and means for comparing a desired value of the intensity to the sensed intensity to produce an intensity variation signal. The system further comprises means for sensing the wavelength of the optical signal and means for comparing a desired value of the wavelength to the sensed wavelength to produce a wavelength error signal. The system additionally includes means for producing a temperature variations signal that is a function of the wavelength and intensity error signals which are temperature dependent and means for producing an injection current variations signal that is a function of the wavelength and intensity error signals which are dependent on injection current. The system also includes means for adjusting the temperature of the laser diode as a function of the temperature variations signal and means for adjusting the injection current of the laser diode as a function of the injection current variations signal.

DESCRIPTION OF THE PREFERRED EMBODIMENT

Figure 1:
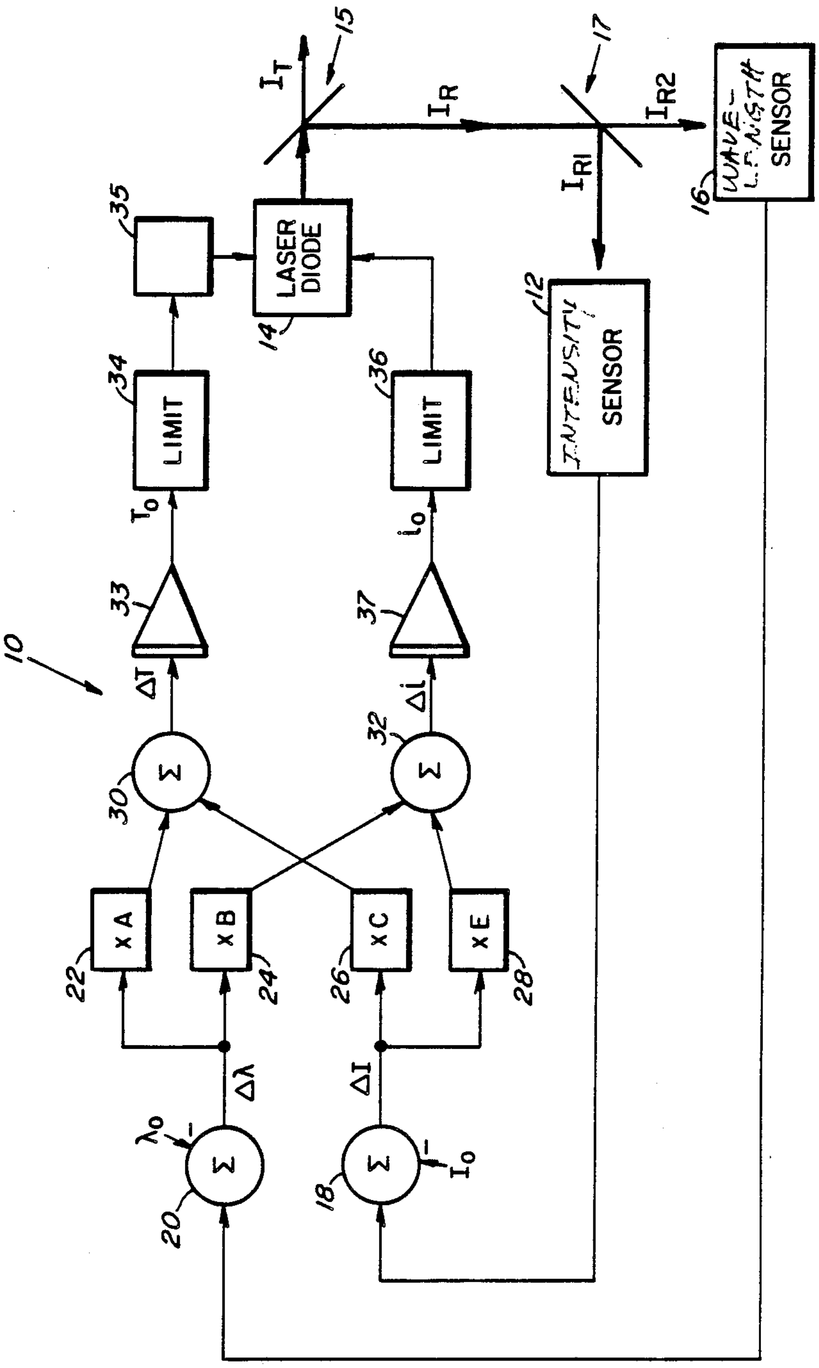
FIG. 1 is a block diagram of the circuitry of the invention.

The intensity and the wavelength of a laser diode are non-linear functions of the injection current and the operating temperature of the laser diode. If a laser diode is operated over narrow temperature and current ranges, the optical intensity, the optical wavelength, the injection current and the temperature of the laser diode are related by the following equations:

$$\Delta I=(\delta I/\delta i)_{To}\Delta i+(\delta I/\delta T)_{io}\Delta T \quad (1)$$

$$\Delta\lambda=(\delta\lambda/\delta i)_{To}\Delta i+(\delta\lambda/\delta T)_{io}\Delta T \quad (2)$$

where:

$\Delta I$ is the variation in intensity of the optical signal output from the diode;

$\Delta\lambda$ is the variation in wavelength of the optical signal output from the laser diode;

$\Delta i$ is the variation in injection current;

$\Delta T$ is the variation in the temperature of the laser diode;

$(\delta I/\delta i)_{To}$ is the variation in intensity due to a variation in the injection current around its operating value $i_o$ at a constant temperature;

$(\delta I/\delta T)_{io}$ is the variation in intensity due to a variation in the temperature of the laser diode around its operating value $T_o$ for a constant value of injection current;

$(\delta\lambda/\delta i)_{To}$ is the variation in optical wavelength due to a variation in the injection current around its operating value $i_o$ at a constant temperature; and $(\delta\lambda/\delta T)_{io}$ is the variation in wavelength due to a variation in the temperature of the laser diode around its operating value $T_o$ for a constant value of injection current.

The partial derivatives defined above are parameters that can be measured for a given laser diode. In principle it is feasible to construct a control circuit to adjust the intensity and wavelength to specific values by varying the diode current (injection current) and temperature about operating values $i_o$ and $T_o$. The control equations are obtained by solving equations (1) and (2) for $\Delta i$ and $\Delta T$:

$$\Delta i=[(\delta\lambda/\delta T)_{io}\Delta I-(\delta I/\delta T)_{io}\Delta\lambda]D^{-1} \quad (3)$$

$$\Delta T=[-(\delta\lambda/\delta i)_{To}\Delta I+(\delta I/\delta i)_{To}\Delta\lambda]D^{-1} \quad (4)$$

$$D=(\delta I/\delta i)_{To}(\delta\lambda/\delta T)_{io}-(\delta I/\delta T)_{io}(\delta\lambda/\delta i)_{To}. \quad (5)$$

It is assumed that D as defined above in Equation (5) is not zero in the ranges of the variables of interest, because it is in the denominator. Equations (3) and (4) may be written in simpler form as follows:

$$\Delta i=[E\Delta I+B\Delta\lambda] \quad (6)$$

$$\Delta T=[C\Delta I+A\Delta\lambda] \quad (7)$$

where $$A=(\delta I/\delta i)_{To}D^{-1}; \quad (8)$$

$$B=-(\delta I/\delta T)_{io}D^{-1}; \quad (9)$$

$$C=-(\delta\lambda/\delta i)_{To}D^{-1} \quad (10)\text{; and,}$$

$$E=(\delta\lambda/\delta T)_{io}D^{-1}. \quad (11)$$

Referring to FIG. 1, a control circuit 10 includes a wavelength sensor 12 that provides a signal output indicative of the wavelength of light emitted by a laser diode 14. The output beam of the laser diode 14 is incident upon a first beam splitter 15, which passes most of the laser diode output undeflected to allow it to propagate to other apparatus (not shown) positioned to receive light from the laser diode 14. A portion $I_r$ of the laser diode output is reflected by the beamsplitter 15 to a second beam splitter 17, which directs a portion $I_{r1}$ of the laser diode output $I_r$ to the wavelength sensor 12. The wavelength sensor 12 may be any well known means such as an absorption detector or a Faraday detector in an alkali metal vapor.

A second portion $I_{r2}$ of the intensity $I_r$ incident upon the second beamsplitter 17 passes through the beamsplitter 17 to impinge upon an intensity sensor 16. The intensity sensor 16 provides a signal output indicative of the intensity of the light emitted by the laser diode 14. The intensity sensor 16 may be a photodiode, for example. There are many known methods for determining the intensity and wavelength of a laser diode, the methods given herein being only exemplary of methods found to be satisfactory for practicing the invention.

Referring to FIG. 1, the control circuit 10 is a feedback control circuit. It is well known that in a fiber optic gyroscope, the rate of rotation is directly proportional to the frequency of the light propagating therein. Therefore, it is desired that the light source provide light at a specific constant frequency or wavelength. The function of the control circuit 10 is to maintain fixed values of wavelength $\lambda$ and intensity I. Reference signals for wavelength and intensity are $\lambda_o$ and $I_o$, respectively signal indicative of an estimate of the desired intensity $I_o$ to a summing circuit 18. A signal indicative of an estimate of the desired wavelength $\lambda_o$ to a summing circuit 20. The summing circuits 18 and 20 subtract desired values of $I_o$ and $\lambda_o$ from the estimates I and $\lambda$ to produce the error signals:

$$I-I_o=\Delta I \quad (12)$$

$$\lambda-\lambda_o=\Delta\lambda, \quad (13)$$

respectively. The values of $\Delta I$ and $\Delta\lambda$ given above are processed to obtain estimates of the variation $\Delta i$ in the injection current and the variation $\Delta T$ in the temperature of the laser diode 14. These errors are integrated over time to obtain the desired injection current and temperature.

Referring to FIG. 1, a signal, $\Delta\lambda$, is indicative of the difference between the actual wavelength and the desired wavelength. It is output from the summing circuit 20 and is input to a pair of multiplying circuits 22 and 24. The multiplying circuit 22 multiplies the $\Delta\lambda$ signal by $A=(\delta I/\delta i)_{To}D^{-1}$, and the multiplying circuit 24 multiplies the $\Delta\lambda$ signal by $B=-(\delta I/\delta T)_{io}D^{-1}$. Similarly, the summing circuit 18 outputs a signal, $\Delta I$, indicative of the difference between the actual intensity and the desired intensity $I_o$. to a pair of multiplying circuits 26 and 28. The multiplying circuit 26 multiplies the intensity signal, $\Delta I$, by $C=-(\delta\lambda/\delta T)_{io}D^{-1}$, and the multiplying circuit 28 multiplies the current signal by $E=(\delta\lambda/\delta T)_{io}D^{-1}$.

The output, $A\Delta\lambda$, of the multiplying circuit 22 and the output, $C\Delta I$, of the multiplying 26 are input to a summing circuit 30. The output of the summing circuit 30 is $\Delta T=[-(\delta\lambda/\delta i)_{To}\Delta I+(\delta I/\delta i)_{To}\Delta\lambda]D^{-1}$. The output $B\Delta\lambda$ of the multiplying circuit 24 and the output $E\Delta I$ of the multiplying circuit 28 are input to a summing circuit 32. The output of the summing circuit 32 is $\Delta i=[(\delta\lambda/\delta T)_{io}\Delta I-(\delta I/\delta T)_{io}\Delta\lambda]D^{-1}$.

An integrator 33 integrates the output of the summing circuit 30 to produce a temperature control signal $T_o$, which is applied through a limiter 34 to a temperature control device 35 that is in thermal contact with the laser diode 14. The limiter 34 prevents excessive currents from reaching the temperature control device 35. The temperature control device 35 may have several different embodiments. One type of temperature control device that functions satisfactorily in the present invention is a Peltier effect device. The Peltier effect is a well-known solid state phenomenon in which the temperature of a junction between two dissimilar metals varies with the application of electric current thereto.

Similarly, an integrator 37 integrates the output of the summing circuit 32 to provide an injection current control signal $i_o$, which is applied to the laser diode 14 through a limiter 36. The limiter 36 prevents the application of excessive injection currents to the laser diode 14 in order to prevent destruction thereof.

If the dynamic ranges of the dependent variables, wavelength $\lambda$ and intensity I, are limited to small operating ranges around the control points $\lambda_o$ and $I_o$, the wavelength and the intensity may be expressed in Laurent series as $$\lambda=\lambda_o+\delta\lambda/\delta T+\delta\lambda/\delta i \quad (14)$$

and $$I=I_o+\delta I/\delta T+\delta I/\delta i, \quad (15)$$

where all higher order terms are regarded as being negligible.

The equations governing the control circuit of FIG. 1 are:

$$\tau_1^{-1}\int[A(\lambda-\lambda_o)+C(I-I_o)]dt=T \text{ for temperature} \quad (16)$$

and $$\tau_2^{-1}\int[B(\lambda-\lambda_o)+E(I-I_o)]dt=i \text{ for injection current,} \quad (17)$$

where $\tau_1$ and $\tau_2$ are time constants and the other terms have been previously defined. These control equations may also be written as $$\tau_1 dT/dt=A(\lambda-\lambda_o)+C(I-I_o) \quad (18)$$

and $$\tau_2 di/dt=B(\lambda-\lambda_o)+E(I-I_o) \quad (19)$$

To simplify the notation, the partial derivatives in the above equations may be written as $\alpha=\delta I/\delta i|_{i=io}$; $\beta=\delta I/\delta T|_{T=To}$; $\gamma=\delta\lambda/\delta i|_{i=io}$; and $\epsilon=\delta\lambda/\delta T|_{T=To}$. The Laurent expansions may be written as $$\lambda=\lambda_o+\epsilon(T-T_o)+\gamma(i-i_o) \quad (20)$$

and $$I=I_o+\beta(T-T_o)+\alpha(i-i_o). \quad (21)$$

Substituting the Laurent expansions of Equations (17) and (18) into the differential equations gives:

$$\tau_1 dT/dt=A[\epsilon(T-T_o)+\gamma(i-i_o)]+C[\beta(T-T_o)+\alpha(i-i_o)] \quad (22)$$

and $$\tau_2 di/dt=B[\epsilon(T-T_o)+\gamma(i-i_o)]+E[\beta(T-T_o)+\alpha(i-i_o)]. \quad (23)$$

The differential equations may be rewritten to facilitate their solution:

$$[(A\epsilon+C\beta)-\tau_1 d/dt](T-T_o)+(A\gamma+C\alpha)(i-i_o)=0. \quad (25)$$

$$[(B\gamma+E\alpha)-\tau_2 d/dt](i-i_o)+(B\epsilon+E\beta)(T-T_o)=0. \quad (26)$$

Solving Equations (25) and (26) to obtain a differential equation having only the injection current,i, as a variable gives $$\tau_1\tau_2 d^2i/dt^2-[(A\epsilon+C\beta)\tau_2+(B\gamma+E\alpha)\tau_1]di/dt+[(A\epsilon+C\beta)(B\gamma+E\alpha)-(B\epsilon+E\beta)(A\gamma k+C\alpha)](i-i_o)=0. \quad (27)$$

Equation (27) for the injection current is in the basic form of a damped harmonic oscillator, whose solution is well-known. Equations (25) and (26) may also be solved to obtain a differential equation of the form of Equation 27 having only the temperature, T, as a variable. The closed loop temperature differential equation is also in the form of a damped harmonic oscillator. The models of the injection current and the laser diode temperature discussed herein are valid for a small parameter linearization of the operational characteristics of the laser diode 14.

Considering the case when the coefficients A, B, C, and E are set equal to the partial derivatives $\alpha=AD$; $\beta=-BD$; $\gamma=-CD$ and $\epsilon=ED$ by inserting these values into Equation (23), the solutions for injection current and temperature uncouple and reduce to simple exponentials. Therefore, inclusion of the cross terms involving B and C effectively decouples the time responses of the current and temperature. Decoupling the current and temperature time responses allows independent adjustment of the time constants of the exponential expressions for injection current and temperature. By providing the capability of independently adjusting the time constants of the injection current and temperature variations, the apparatus and method of the present invention assures that the desired signal wavelength and intensity may be obtained in a time efficient manner. The time constants may adjusted to suitable values to avoid oscillations of the wavelength and intensity about the desired values, thereby overcoming disadvantages of prior systems for controlling laser diode output signals.

Figure 2:
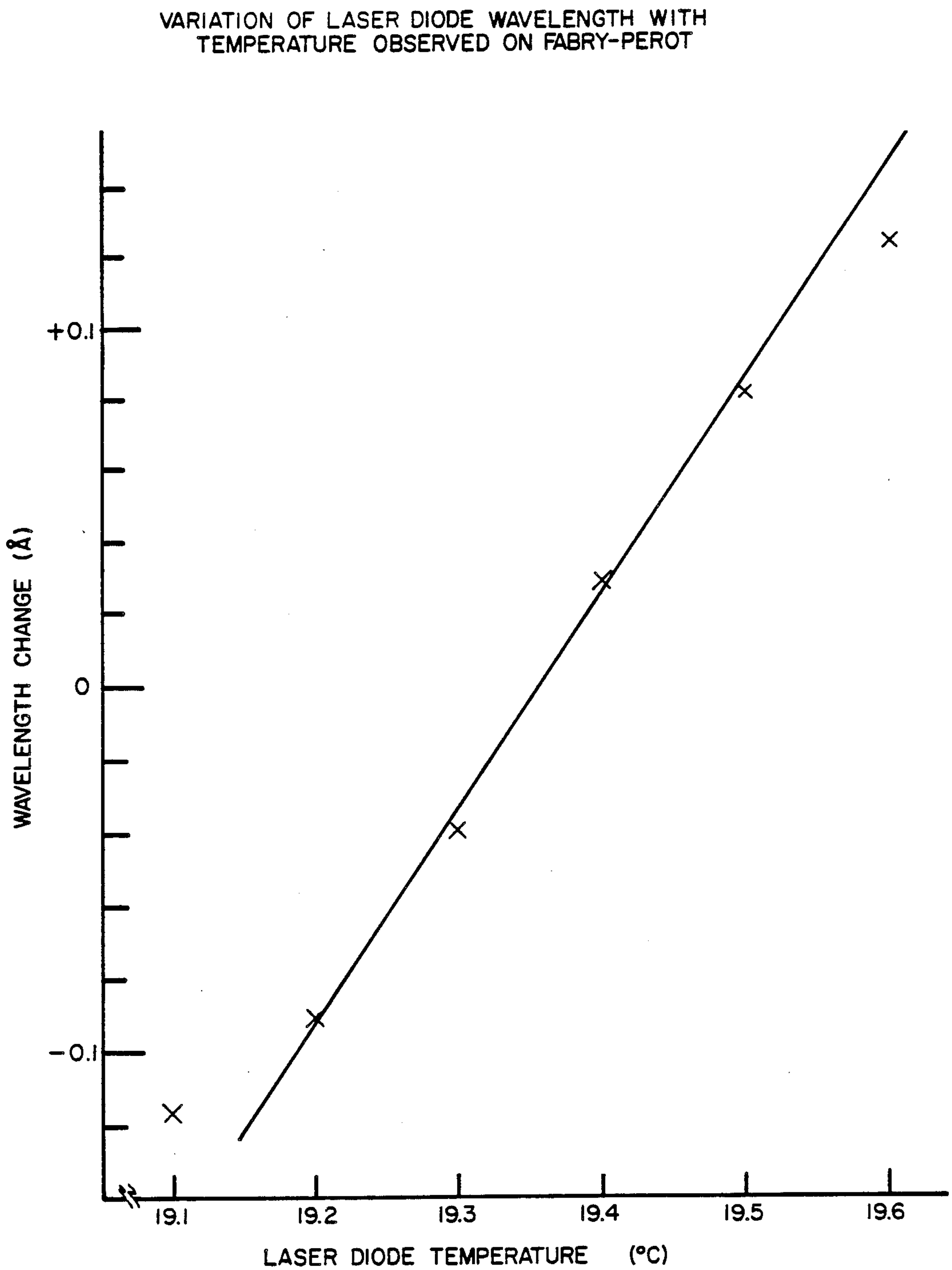
FIG. 2 is a graph of wavelength change as a function of laser diode temperature.
Figure 3:
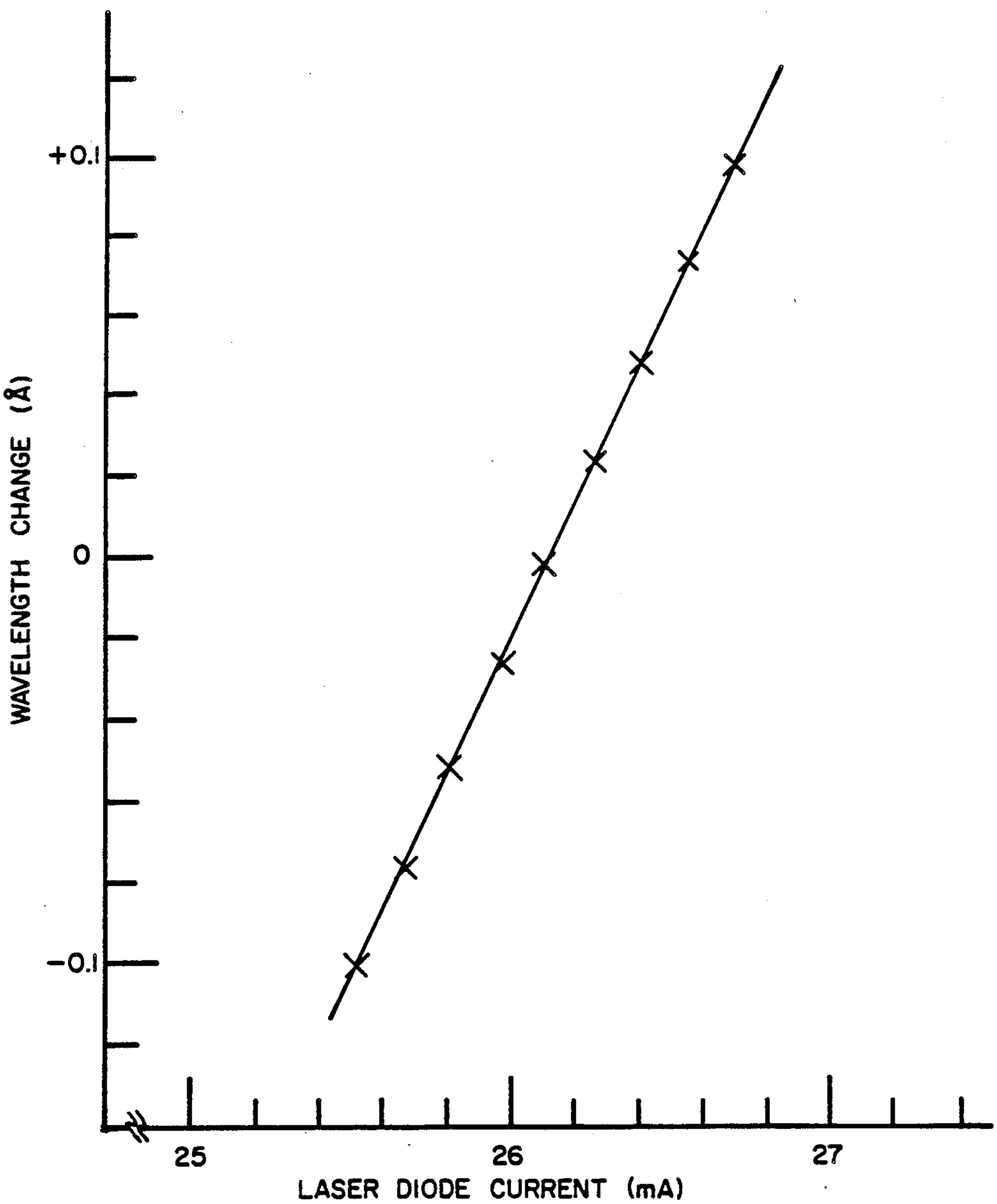
FIG. 3 is a graph of wavelength change as a function of laser diode injection current.

The values of the partial derivatives used in the above analysis may be determined by measuring $\delta\lambda/\delta T$ and $\delta\lambda/\delta I$ for the laser diode 14 For example, Referring to FIG. 2, for a quiescent wavelength $\lambda_o$ of 7800A, the partial derivative $\delta\lambda/\delta T$ is the slope of the graph and has a value of about 0.605 Angstroms per degree Celcius. Referring to FIG. 3, for a quiescent wavelength $\lambda_o$ of 7950A, the partial derivative $\delta\lambda/\delta i$ is about 0.196 Angstroms per milliampere.

The partial derivatives $\delta I/\delta T$ and $\delta I/\delta i$ may be determined from measurements of the rate of change of intensity with small temperature changes about the selected operating temperature of the laser diode 14 and from measurements of the rate of change of intensity for small injection current changes about the operating current. If there are small errors in the measurements of the partial derivatives, the small perturbation solutions given herein may be approximated by a linear superposition of a real exponential and a small harmonic component due to the small amount of coupling between the injection current and temperature. The harmonic component is damped and appears only after being excited by system noise or an external perturbation and is not deleterious to system performance.

What is claimed is:

1. A method for simultaneously controlling the intensity and wavelength of an optical signal output from a laser diode, comprising the steps of:
- sensing the intensity of the optical signal;
- comparing a desired value of the intensity to the sensed intensity to produce an intensity error signal;
- sensing the wavelength of the optical signal;
- comparing a desired value of the wavelength to the sensed wavelength to produce a wavelength error signal;
- multiplying the wavelength error signal by a first numerical factor and a second numerical factor;
- multiplying the intensity error signal by a third numerical factor and a fourth numerical factor;
- adding the product of the wavelength error signal and the first numerical factor to the product of the intensity error signal and the third numerical factor to produce a temperature variation signal;
- adding the product of the wavelength error signal and the second numerical factor to the product of the intensity error signal and the fourth numerical factor to produce an injection current variation signal;
- adjusting the temperature of the laser diode as a function of the temperature variation signal; and
- adjusting the injection current of the laser diode as a function of the injection current variation signal.

2. The method of claim 1 including the steps of: determining the first numerical factor as a function of the rate of change of intensity of the optical signal with respect to injection current of the laser diode at a predetermined operating temperature of the laser diode;
- determining the second numerical factor as a function of the rate of change of intensity with respect to temperature of the laser diode at a predetermined operating injection current;
- determining the third numerical factor as a function of the rate of change of wavelength of the optical signal with respect to injection current of the laser diode at a predetermined operating temperature of the laser diode; and
- determining the fourth constant as a function of the rate of change of wavelength with respect to temperature of the laser diode at a predetermined operating injection current.

3. A method for simultaneously controlling the intensity and wavelength of an optical signal output from a laser diode, comprising the steps of:
- sensing the intensity of the optical signal;
- sensing the wavelength of the optical signal;
- comparing the selected value of the intensity to the sensed intensity to produce an intensity error signal by determining time variations of the laser diode injection current from a value of the injection current that corresponds to a selected intensity and a selected wavelength of the optical signal output from the laser diode;
- comparing the selected value of the wavelength to the sensed wavelength to produce a wavelength error signal;
- determining time variations of the laser diode operating temperature from a value of the operating temperature that corresponds to a selected intensity and a selected wavelength of the optical signal output from the laser diode;
- decoupling variations in the injection current as a function of time from variations in operating temperature as a function of time;
- producing a temperature variation signal that is a function of the wavelength and intensity error signals;
- adjusting the injection current and operating temperature independently of one another to maintain the intensity and wavelength of the signal output from the laser diode within predetermined limits of selected values thereof;
- adjusting the temperature of the laser diode as a function of the temperature variation signal; and
- adjusting the injection current of the laser diode as a function of the injection current variation signal.

4. The method of claim 3, further including the steps of:
- determining time variations of the laser diode injection current for a fixed operating temperature; and
- determining time variations of the laser diode operating temperature for a fixed injection current.

5. A system for simultaneously controlling the intensity and wavelength of an optical signal output from a laser diode, comprising:
- means for sensing the intensity of the optical signal;
- means for comparing a desired value of the intensity to the sensed intensity to produce an intensity error signal;
- means for sensing the wavelength of the optical signal;
- means for comparing a desired value of the wavelength to the sensed wavelength to produce a wavelength error signal;
- means for multiplying the wavelength error signal by a first numerical factor and a second numerical factor;
- means for multiplying the intensity error signal by a third numerical factor and a fourth numerical factor;
- means for adding the product of the wavelength error signal and the first numerical factor to the product of the intensity error signal and the third numerical factor to produce a temperature variation signal;

means for adding the product of the wavelength error signal and the second numerical factor to the product of the intensity error signal and the fourth numerical factor to produce an injection current variation signal;

means for adjusting the temperature of the laser diode as a function of the temperature variation signal; and means for adjusting the injection current of the laser diode as a function of the injection current variation signal.

6. The system of claim 5 including:

means for determining the first numerical factor as a function of the rate of change of intensity of the optical signal with respect to injection current of the laser diode at a predetermined operating temperature of the laser diode;

means for determining the first numerical factor as a function of the rate of change of intensity with respect to temperature of the laser diode at a predetermined operating injection current;

means for determining the first numerical factor as a function of the rate of change of wavelength of the optical signal with respect to injection current of the laser diode at a predetermined operating temperature of the laser diode; and means for determining the first numerical factor as a function of the rate of change of wavelength with respect to temperature of the laser diode at a predetermined operating injection current.

7. A system for simultaneously controlling the intensity and wavelength of an optical signal output from a laser diode, comprising:

means for sensing the intensity of the optical signal;

means for sensing the wavelength of the optical signal;

means for comparing the selected value of the intensity to the sensed intensity to produce an intensity error signal determining time variations of the laser diode injection current from a value of the injection current that corresponds to a selected intensity and a selected wavelength of the optical signal output from the laser diode;

means for comparing the selected value of the wavelength to the sensed wavelength to produce a wavelength error signal;

means for determining time variations of the laser diode operating temperature from a value of the operating temperature that corresponds to a selected intensity and a selected wavelength of the optical signal output from the laser diode;

means for decoupling variations in the injection current as a function of time from variations in operating temperature as a function of time;

means for producing a temperature variation signal that is a function of the wavelength and intensity error signals;

means for producing an injection current variation signal that is a function of the wavelength and intensity error signals;

means for adjusting the temperature of the laser diode as a function of the temperature variation signal;

means for adjusting the injection current of the laser diode as a function of the injection current variation signal; and means for adjusting the injection current and operating temperature independently of one another to maintain the intensity and wavelength of the signal output from the laser diode within predetermined limits of selected values thereof.

8. The system of claim 7, further including:

means for determining time variations of the laser diode injection current for a fixed operating temperature; and means for determining time variations of the laser diode operating temperature for a fixed injection current.

* * * * *